United States Patent [19]

Itoh et al.

[11] Patent Number: 5,047,647
[45] Date of Patent: Sep. 10, 1991

[54] ELECTRON BEAM LITHOGRAPHY APPARATUS

[75] Inventors: Hiroyuki Itoh, Kodaira; Kenichi Hirane, Hitachi, both of Japan

[73] Assignees: Hitachi, Ltd., Tokyo; Hitachi Instrument Engineering Co., Ibaraki, both of Japan

[21] Appl. No.: 582,083

[22] Filed: Sep. 14, 1990

[30] Foreign Application Priority Data

Sep. 28, 1989 [JP] Japan .................................. 1-250479

[51] Int. Cl.$^5$ ............................................ H01J 37/153
[52] U.S. Cl. ................................ 250/491.1; 250/398; 250/397; 250/492.2
[58] Field of Search ................ 250/491.1, 396 R, 398, 250/397, 310, 492.2

[56] References Cited

U.S. PATENT DOCUMENTS

| 4,390,788 | 6/1983 | Hayashi et al. | 250/491.1 |
| 4,511,980 | 4/1985 | Watanabe | 250/398 |
| 4,558,225 | 12/1985 | Gotou et al. | 250/491.1 |
| 4,647,782 | 3/1987 | Wada et al. | 250/398 |
| 4,789,945 | 12/1988 | Niijima | 250/491.1 |

FOREIGN PATENT DOCUMENTS 62-281246  4/1987  Japan .

Primary Examiner—Bruce C. Anderson
Attorney, Agent, or Firm—Antonelli, Terry, Stout & Kraus

[57] ABSTRACT

An electron beam lithography apparatus comprising an electron lens, a deflector, a reflective electron detector of marks on a stage or a specimen thereon when the deflector scans the marks, and a means for memorizing high order polynomial equations and calculating a correcting value of the deflector controlling means based on the high order polynomial equations, wherein all coefficients of the high order polynomial equation are calculated when the electron beam lithography apparatus starts up, and after then, coefficient of the first order term is calculated from the position signals of the marks frequently in a short cycle.

8 Claims, 2 Drawing Sheets

ELECTRON BEAM LITHOGRAPHY APPARATUS

BACKGROUND OF THE INVENTION

The present invention relates to an electron beam lithography apparatus and more particularly to a correcting apparatus for correcting a lithographic distortion of the electron beam in high speed.

In the general electron beam lithography apparatus, the most popular one is an apparatus in which many marks is scanned by an electron beam so that positions of the marks are detected. At this time, the mark means a fiducial mark as a standard mark which is mounted on a stage mounting a wafer, and further the mark may be an alignment mark installed on the wafer. The detected positions of the marks are compared with previously measured positions corresponding to the detected positions which are previously measured by using a laser measurement system, and the deflecting current of the deflector is calculated so as to minimize the deflecting gain errors using a method of least squares.

That is to say, differences $\Delta x$ and $\Delta y$ between the detected positions of the marks and the previously measured positions (x,y) corresponding to the detected positions are calculated, optimum coefficients of the following equations (11), (12) are obtained using a method of least squares, and the deflecting current which corrects the positional errors $\Delta x$ and $\Delta y$ of the mark is calculated.

$$\Delta x = a_{00} + (a_{10}x + a_{01}y) + (a_{20}x^2 + a_{11}xy + a_{02}y^2) + (a_{30}x^3 + a_{21}x^2y + a_{12}xy^2 + a_{03}y^3) + \ldots \quad (11)$$

$$\Delta y = b_{00} + (b_{10}x + b_{01}y) + (b_{20}x^2 + b_{11}xy + b_{02}y^2) + (b_{30}x^3 + b_{21}x^2y + b_{12}xy^2 + b_{03}y^3) + \ldots \quad (12)$$

In the high order polynomial equations (11), (12), $a_{00}$ and $b_{00}$ are offset values, coefficients $a_{10}$, $a_{01}$, $b_{10}$ and $b_{01}$ of the first order variables correspond to deflective sensitivity error components as shown in FIG. 3(A) or rotational error components as shown in FIG. 3(B) which vary relatively in short time, coefficients $a_{20}$, $a^{11}$, $a_{02}$, $b_{20}$, $b_{11}$ and $b_{02}$ of the second order variables are an axial asymmetry components of the electron beam and coefficients $a_{30}$, $a_{21}$, $a_{12}$, $a_{03}$, $b_{30}$, $b_{21}$, $b_{12}$ and $b_{03}$ of the third order variables are pin/barrel distortion components.

Generally, setting many marks more than ten and detecting the positions of all of the marks, all of the coefficients in the equations (11), (12) are frequently calculated within a short cycle such as one hour or two hours in order to correct the deflecting gain errors of the electron beam lithography apparatus and it takes a pretty long time for every calculations performed frequently. Therefore, the working efficiency of the electron beam lithography apparatus became very low.

Furthermore, as marks on the specimen are scanned by electron beam in order to detect the positions of the marks, stains or blots are generated in the specimen chamber and contaminate the specimen so as to make the lithographic accuracy of the apparatus low. The Japanese Patent Laid-open No. 62-281246 is cited as an example of such apparatus.

SUMMARY OF THE INVENTION

The present invention has been accomplished to overcome the above mentioned problem of the conventional technique.

An object of present invention is to provide an electron beam lithography apparatus which can calculate a deflecting current correcting the deflecting gain error in a short time so as to improve the working efficiency of the electron beam lithography apparatus and at the same time to improve the lithographic accuracy of the apparatus.

In order to attain the above object, corresponding to the time dependency of the deflecting gains errors, the deflecting current correcting the deflecting gain errors is calculated, that is to say, in the case of the deflecting gain errors which varies in the short time, deflecting current is frequently calculated, and in the case of the deflecting gain errors which varies relatively in a long time, the deflecting current is calculated in the long time, whereby the calculation time of the deflecting gain error can be reduced as a whole.

More in detail, an electron beam lithography apparatus of the present invention comprises a means for detecting the marks in the scanning field by an electron beam, comparing the detected positions of the mark with the positions previously measured by using a laser length measuring machine corresponding to the detected positions of the marks and calculating coefficients of a high order polynominal equation consisting of at least the first, second and third order terms in order to correct the deflecting errors, and further comprises a means for selecting and executing one of two calculating methods, wherein one method is to calculate all of the coefficients by detecting the all of the marks and the other method is to calculate the coefficients of the first order terms by detecting some of the marks.

Moreover, the calculation of the all coefficients in the longer cycle are taken place when the electron beam lithography apparatus stars up, and after that, the calculation of the coefficients of the first order position variables in the short cycle are taken place by an output from a timer which is set the short cycle.

Furthermore, a thermometer or an atmospheric pressure detecting mean which are set a predetermined value so as to detect in the short cycle may be used in stead of the timer.

As the error of the deflecting current which is represented by the higher order polynomial equation is selectively executed the two methods of calculating all of the coefficients and calculating the coefficients of the first order terms in the present invention as stated above, the total calculating time of the deflecting current error becomes effectively short and furthermore, the contamination of the electron beam lithography apparatus caused by repetitive scanning of the marks for error correction of the deflecting current is remarkably reduced too.

DETAILED DESCRIPTION OF THE PREFERRED EMBODIMENTS

An embodiment of an electron beam lithography apparatus in the present invention will be explained using FIGS. 1 to 3.

Figure 1:
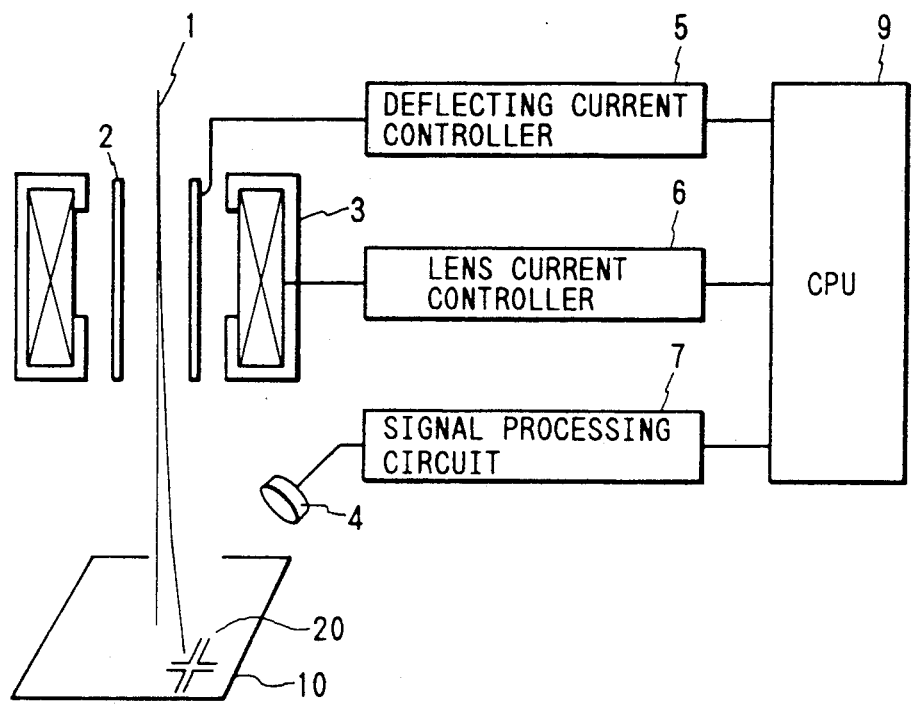
FIG. 1 is a diagrammatic view showing an embodiment of an electron beam lithography apparatus in the present invention.

FIG. 1 shows a diagrammatic view of the electron beam lithography apparatus, in which electron beam 1 is focussed on the surface of the specimen by an electron lens 3, is scanned by a deflector 2 and, at the same time, is controlled the strength of the electron beam corresponding to an image for the lithography. In FIG. 1, numeral 5 denotes a deflecting current controller for controlling deflecting current of the deflector 2 and numeral 6 denotes a lens current controller for controlling the current of the electron lens 3. Numeral 4 denotes a detector for detecting electrons reflected from mark 20 on the specimen 10 when the deflector 2 deflects the electron beam 1 so as to scan the mark 20, wherein the mark 20 is a fiducial mark as a standard mark which is disposed on a stage mounting a specimen 10 such as wafer, and further the mark 20 may be an alignment mark installed on the specimen 10. Numeral 7 denotes a signal processing circuit for obtaining position signals (x,y) of the mark 20 by processing an output of the detector 4. Numeral 9 is a CPU which controls the strength of the electron beam 1 and, at the same time, calculates a deflecting current of the controller 5 which is corrected based on high order polynomial equations (11), (12) consisting of at least the first order terms consisting of a first position variables x, y and coefficients thereof, the second order terms consisting of a second position variables $x^2$, $xy$, $y^2$ and coefficients thereof, and the third order terms consisting of third position variables $x^3$, $x^2y$, $xy^2$, $y^3$ and coefficients thereof. The CPU calculates coefficients by using two methods, the first method is to calculate the coefficients of the first order terms by detecting the position (x,y) of at least two marks in a short cycle. In this embodiment, the coefficients of the first order terms is calculated by detecting the position of four marks disposed in the corner of scanning field. And the second method in the two methods is to calculate all coefficients $a_{10}$, $a_{01}$, $b_{10}$, $b_{01}$, $a_{20}$, $a_{11}$, $a_{02}$, $b_{20}$, $b_{11}$, $b_{02}$, $a_{30}$, $a_{21}$, $a_{12}$, $a_{03}$, $b_{30}$, $b_{21}$, $b_{12}$ and $b_{03}$ of all terms in the high order polynomials equation by detecting the position of all marks in a longer cycle than the above short cycle. At time, when number of the all coefficients which are calculated are twenty, the positions of the ten marks are detected in X and Y directions.

Figure 2:
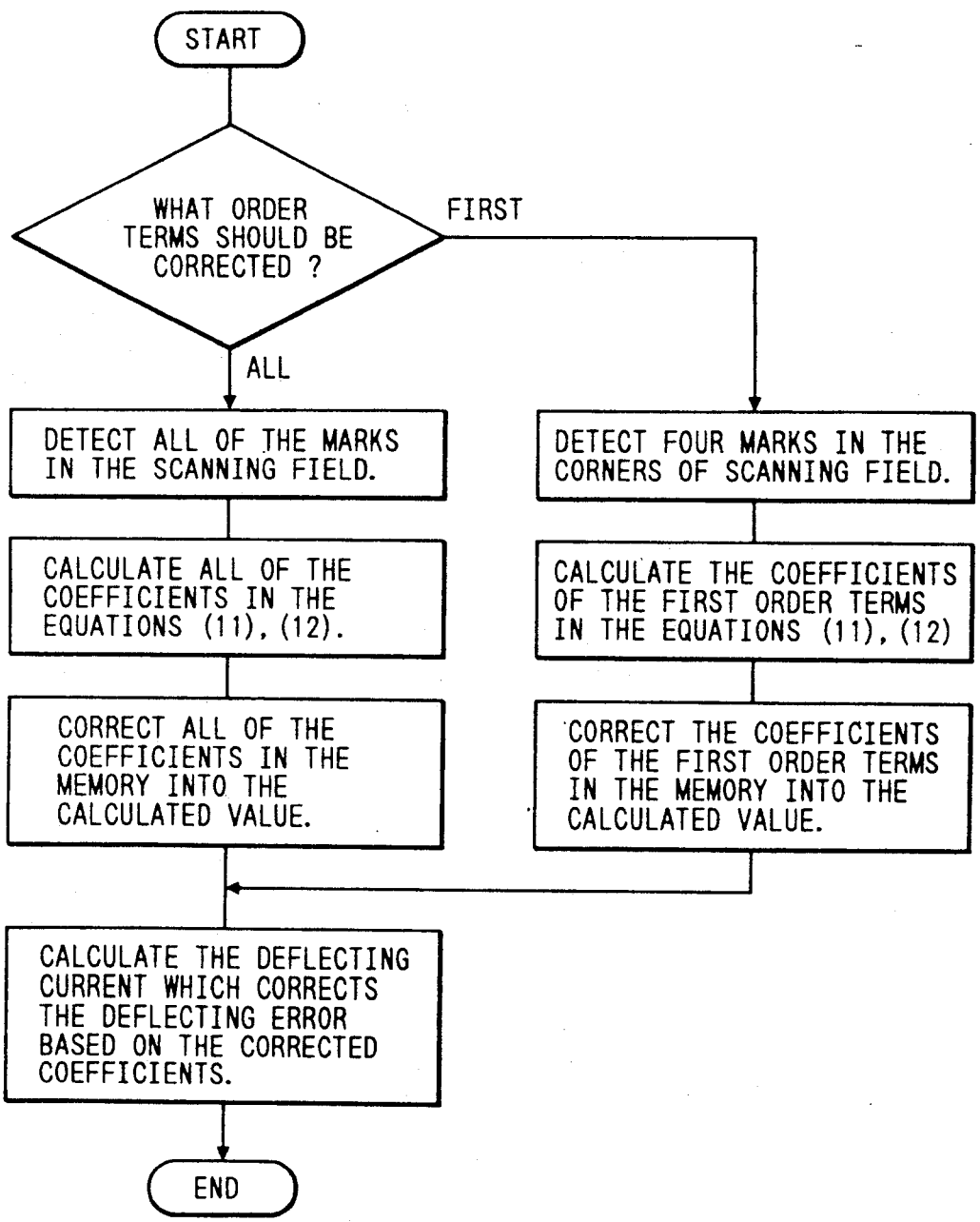
FIG. 2 is a flow chart showing a calculating method in the electron beam lithography apparatus shown in FIG. 1.

FIG. 2 is a flow chart which shows the calculation of the correcting value of the deflector controller 5 which is performed by the CPU 9.

In FIG. 2, after the electron beam lithography apparatus starts, the CPU 9 judges what the coefficient of the order variables should be corrected. After the electron beam lithography apparatus starts up on that day when the inside of the apparatus is cleaned, when some parts of the apparatus are changed in order to maintain a good condition of the apparatus etc., the second method which calculates the all coefficients is selected at first. After then, the first method which calculates the all coefficients is selected in the predetermined short cycle by a timer which is not shown in FIGS. (step 11).

In the high degree polynomial equations (11), (12) which are memorized in the CPU 9, the coefficients of the third degree the terms relate to pin/barrel distortion components which is peculiar to electronic optical system of the electron beam lithography apparatus. The pin/barrel distortion components are hardly changed with the variation of the temperature etc., but a variation with the passing of time in a long time caused by stains or blots generates so as to result the distortion components. Therefore, the coefficients of the third degree terms should be calculated so as to correct the pin/barrel distortion components within about three months. The coefficients of the second degree terms relate to an axial drift components of the electron beam and changing of the axial drift is taken place slowly in a cycle of few hours.

Figure 3A:
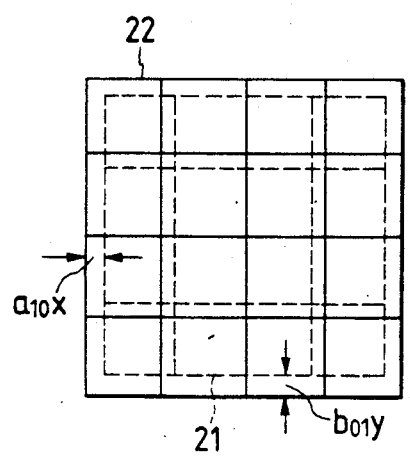
FIG. 3 is a schematic diagram showing deflective distortion of the electron beam relating to the present invention.
Figure 3B:
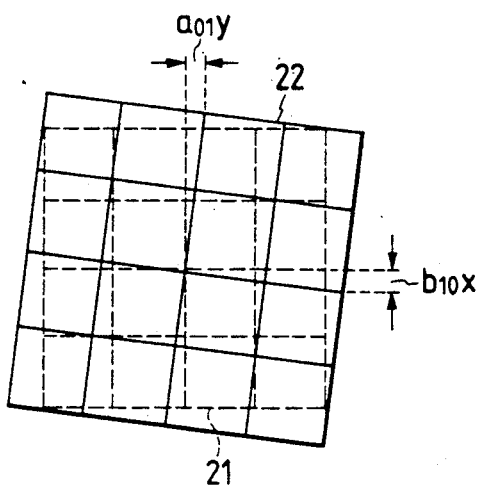

The coefficients of the first order terms relate to variations in the electron beam reflector system and the electronic lens system and the changing thereof is taken place in a short cycle. For example, a deflective sensitivity error components $a_{10}x$, $b_{01}y$ as shown in FIG. 3(A) are generated and a rotational error components $b_{10}x$, $a_{01}y$ as shown in FIG. 3(B) are generated by a gain variation of the deflector controller 5, and further both of the deflective sensitivity error components and the rotational error components are generated at the same time by a variation of the relative position of the specimen or excitation of the electronic lens. The coefficients of the first order terms are generated by relatively in a short cycle such as one or two hours.

Therefore, in the present invention, when the electron beam lithography apparatus starts up, the deflector 2 deflects the electron beam 1 and scans all of the marks on the specimen 10 so as to detect the positions of the all marks in the scanning field of the specimen. All of the coefficients of the high order polynomial equations (11), (12) are calculated by comparing the detected positions of marks with the positions of the marks previously measured by using the laser length measurement system corresponding to the detected position of marks (step 13), and correct the all of the coefficients in the memory into the calculated value (step 14). The deflecting current of the deflector 2 which corrects the deflecting errors are calculated using the corrected coefficients the all terms and the high order polynomial equation (step 15).

After that, a timer initiate the step 11 in every one or two hours and the coefficient of the first order variables is selected to be corrected (step 11). At this time, in stead of the timer, a thermometer or an atmospheric pressure detecting mean which are set a predetermined value of temperature or pressure in the circumference of the electron beam lithography apparatus so as to output a signal in the short cycle may be used.

In the calculation of the coefficients of the first order terms, four marks in the corner are scanned so as to detect the positions of the marks (step 16) and the coefficients of the first order terms in the equation (11), (12) are calculated (step 17). Then the coefficients of the first order memorized in the memory are corrected (step 18) and the deflecting current of the deflector 2 which corrects the deflecting gain errors are calculated using the corrected coefficients of the first order terms and the high order polynomial equation (step 15).

In the present invention, after the electron beam lithography apparatus start up and all of the coefficients are corrected, the calculation of the coefficients of the first order terms may be executed by detecting temperature changing from a thermometer or detecting pressure changing from an atmospheric pressure detecting means around the electron beam lithography apparatus.

We claim:

1. An electron beam lithography apparatus comprising:
   an electron lens for focusing an electron beam on to a specimen;
   a means for controlling current of the electron lens;
   a deflector for deflecting the electron beam;
   a means for controlling the deflector; a detector for detecting a reflective electron from marks relating the specimen when the deflector deflects the electron beam so as to scan the marks;
   a signal processing circuit for obtaining position signals of the marks by processing an output of the detector; and
   a means for memorizing high order polynomial equation and calculating a correcting value of the deflector controlling means based on the high order polynomial equations, wherein coefficient of the first order term is calculated from the position signals of the marks in a short cycle and other coefficients of the high order polynomial equation are calculated from the position signals in a longer cycle than said short cycle.

2. An electron beam lithography apparatus as defined in claim 1, further characterized by,
   the means for memorizing the high order polynominal equations consisting of first, second and third order terms of position variables of the marks.

3. An electron beam lithography apparatus as defined in claim 1, further characterized by,
   the means for calculating the correcting value of the deflector based on the high order polynomial equations, wherein coefficient of the first order term is calculated from the position signals of four marks in the corner of the scanning field.

4. An electron beam lithography apparatus as defined in claim 1, further characterized by,
   the means for calculating the correcting value of the deflector based on the high order polynomial equations, wherein other coefficients of the high order polynomial equation are calculated when the electron beam lithography apparatus starts up.

5. An electron beam lithography apparatus as defined in claim 1, further characterized by,
   the means for calculating the correcting value of the deflector based on the high order polynomial equations, wherein coefficient of the first order term is calculated by detecting a temperature around the electron beam lithography apparatus.

6. An electron beam lithography apparatus as defined in claim 1, further characterized by,
   the means for calculating the correcting value of the deflector based on the high order polynomial equations, wherein coefficient of the first order term is calculated by detecting an atmospheric pressure around the electron beam lithography apparatus.

7. An electron beam lithography apparatus comprising:
   an electron lens for focusing an electron beam on to a specimen;
   a means for controlling current of the electron lens;
   a deflector for deflecting the electron beam;
   a means for controlling the deflector;
   a detector for detecting a reflective electron from marks relating the specimen when the the deflector deflects the electron beam so as to scan the marks;
   a signal processing circuit for obtaining position signals of the marks by processing an output of the detector; and
   a means for memorizing high order polynomial equations and calculating a correcting value of the deflector controlling means based on the high order polynomial equations, wherein coefficient of the first order term is calculated from the position signals of the marks in a short cycle and all coefficients of the high order polynomial equation are calculated from the position signals in a longer cycle than said short cycle.

8. An electron beam lithography apparatus as defined in claim 7, further characterized by,
   the means for calculating the correcting value of the deflector based on the higher order polynomial equations, wherein all coefficients of the high order polynomial equation are calculated when the electron beam lithography apparatus starts up.

* * * * *